(12) United States Patent
Vaysse et al.

(10) Patent No.: US 7,042,730 B2
(45) Date of Patent: May 9, 2006

(54) NON-ISOLATED HEATSINK(S) FOR POWER MODULES

(75) Inventors: Bertrand Vaysse, Toulouse (FR); Heny Lin, Irvine, CA (US); Thanh Van Tran, Temple City, CA (US); Ajit Dubhashi, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 186 days.

(21) Appl. No.: 10/631,879

(22) Filed: Jul. 31, 2003

(65) Prior Publication Data

US 2004/0095729 A1 May 20, 2004

Related U.S. Application Data

(60) Provisional application No. 60/400,546, filed on Jul. 31, 2002.

(51) Int. Cl.
*H05K 7/20* (2006.01)
(52) U.S. Cl. .............. 361/719; 361/704; 361/710; 361/717; 361/723; 257/666; 257/667; 257/675; 257/712

(58) Field of Classification Search ............. 361/600, 361/679, 700–715, 717–720, 722–723; 257/666, 257/668, 669, 675, 706–719, 724, 796; 174/52.1, 174/16.3, 50; 165/80.2, 80.3; 438/106, 438/112, 107, 122, 123, 124
See application file for complete search history.

(56) References Cited

U.S. PATENT DOCUMENTS

| | | | |
|---|---|---|---|
| 6,432,750 B1 * | 8/2002 | Jeon et al. ............... 438/122 |
| 6,791,167 B1 * | 9/2004 | Hayashi et al. ........... 257/667 |
| 2002/0109211 A1 * | 8/2002 | Shinohara ................ 257/666 |
| 2003/0075783 A1 * | 4/2003 | Yoshihara et al. ......... 257/675 |

FOREIGN PATENT DOCUMENTS

WO    WO 97/27626    * 7/1997

* cited by examiner

*Primary Examiner*—Michael Datskovskiy
(74) *Attorney, Agent, or Firm*—Ostrolenk, Faber, Gerb & Soffen, LLP

(57) ABSTRACT

A power module including a power circuit having heat generating power devices including one or more heatsinks not isolated from the power devices by an insulating body.

10 Claims, 6 Drawing Sheets

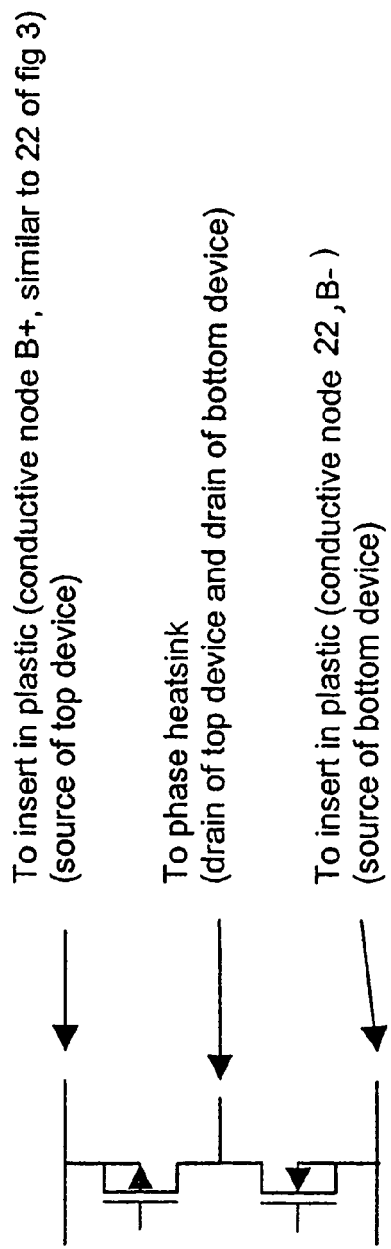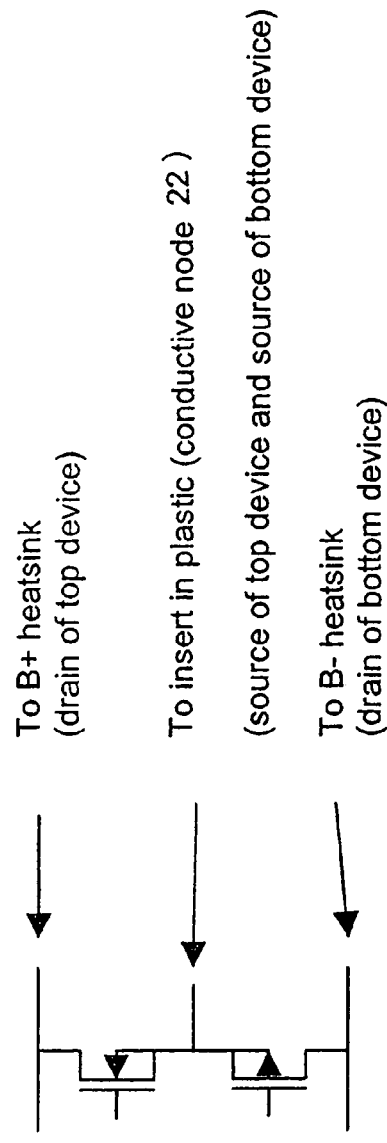
FIG. 4c
FIG. 4d

NON-ISOLATED HEATSINK(S) FOR POWER MODULES

RELATED APPLICATION

The application is based on and claims benefit of U.S. Provisional Application No. 60/400,546, filed Jul. 31, 2002, entitled Non-Isolated Heatsink(s) for Power Modules, to which a claim of priority is hereby made.

FIELD OF INVENTION

The present invention relates to power modules, and more particularly to power modules that include heatsink elements.

BACKGROUND OF THE INVENTION

The thermal performance of a power module is directly linked to the thermal resistance of its material stack.

In typical power modules, the power devices, such as MOSFETs and IGBTs, are soldered to conductive plates. The conductive plates may be electrically isolated from one another because the power devices may be at different potentials. For example, the power module may include a half-bridge circuit that is comprised of two series connected MOSFETs, each of which having a drain contact connected to a respective conductive plate. In such a case, electrical isolation is required because the drains of the MOSFETs have different potentials and may need to be isolated from each other. The isolation may be achieved by forming conductive regions for receiving the power devices on a major surface of an insulated metal substrate (IMS), direct-copper (DBC), or the like or using materials such as SilPads between the power devices and the heatsink to achieve electrical isolation. Such elements contribute to the thermal resistance of the power module. Taking the IMS as an example, an IMS includes an insulating body, such as a ceramic body, having a conductive layer, such as a layer of aluminum, formed on opposing major surfaces thereof. One of the conductive layers may be modified by, for example, etching to include conductive pads for receiving the power devices. Power devices generate heat during operation which can be dissipated from the conductive layer on the opposing surface, especially if a heatsink is attached thereto.

There are disadvantages associated with using an IMS or the like in a power module. For example, an IMS exhibits poor thermal conductivity compared to the rest of the elements in the thermal stack. The poor conductivity is largely caused by the insulating body. Indeed most of the temperature drop appears across the insulating body which, depending on the material, can constitute 50% to 80% of the RthJS of the module.

Also, materials such as IMSs are expensive thus raising the cost of the power module.

SUMMARY OF THE INVENTION

A power module according to the present invention includes a plurality of heatsinks which are not electrically isolated from the power devices by an insulating body such as a ceramic body. As a result the thermal path for the generated heat from the power devices does not include an insulating body which may increase the thermal resistance (RthJS) of the module.

According to one aspect of the present invention when multiple heatsinks are used they can be held together by a frame which is made from an electrically insulative material such as an insulating polymer. Such a frame allows for an integrated cooling arrangement which among other advantages eases the manufacturing of a power module according to the present invention.

A power module according to the present invention is suitable for numerous power module applications including power modules for starters, alternators, electric power steering, engine coolers, variable speed drives, power supplies, etc.

A power module according to the first embodiment of the present invention, for example, includes a half-bridge circuit implemented with two N-channel MOSFETs, each cooled with a respective non-isolated heatsink: one connected to the drain of the high side device (Bus+) and the other one connected to the drain of the low side device (output phase). The two non-isolated heatsinks can be held together in a frame made from an insulating material such as an insulating polymer to obtain an integrated cooling device.

A power module according to the second embodiment of the present invention is a 3-phase power module each phase being implemented by a respective half-bridge arrangement. Each half-bridge arrangement in a power module according to the second embodiment of the present invention includes an N-channel MOSFET (or NPN transistor) to serve the high side of the half-bridge and a P-channel MOSFET (or PNP transistor) to serve the low side of the half-bridge. According to the present invention the N-channel MOSFETs (the high side devices) can have their drains connected to one non-isolated heatsink (e.g. connected to B+) and the P-channel MOSFETs can have their drains connected to the other non-isolated heatsink (e.g. connected to B−). Because no insulating body is used in a power module according to the present invention, the thermal transfer from the power devices to the heatsink is very efficient.

According to an aspect of the present invention, in a power module according to the second embodiment of the present invention, the higher Rdson in the P-channel MOSFETs can be compensated by better thermal coupling to the heatsink (50% to 80% more efficient) so that approximately the same silicon area as a standard module with N-channel MOSFETs can be used. Moreover, because of the improved thermal coupling the N-channel MOSFETs exhibit less losses, making the power module more efficient.

According to another aspect of the present invention, the non-isolated heatsinks can be of different sizes. Specifically, the heatsink associated with the negative pole of the power module (e.g. P-channel MOSFET) may be larger than the heatsink associated with the positive pole of the power module (e.g. N-channel MOSFET) to eliminate the thermal gradient between the non-isolated heatsinks thereby reducing stress on the part.

A module according to the present invention advantageously exhibits better thermal performance. In addition, the stray capacitance inherent in elements that include an insulating body such as IMSs, DBCs, and SilPads is not present, thereby eliminating the high frequency currents caused by the switching of the power devices thus reducing the EMI emissions from the power module.

Other features and advantages of the present invention will become apparent from the following description of the invention which refers to the accompanying drawings.

BRIEF DESCRIPTION OF THE FIGURES

FIGS. 4a–4d illustrate further examples of circuits which can be incorporated in modules according to the present invention.

DETAILED DESCRIPTION OF THE FIGURES

Figure 1:
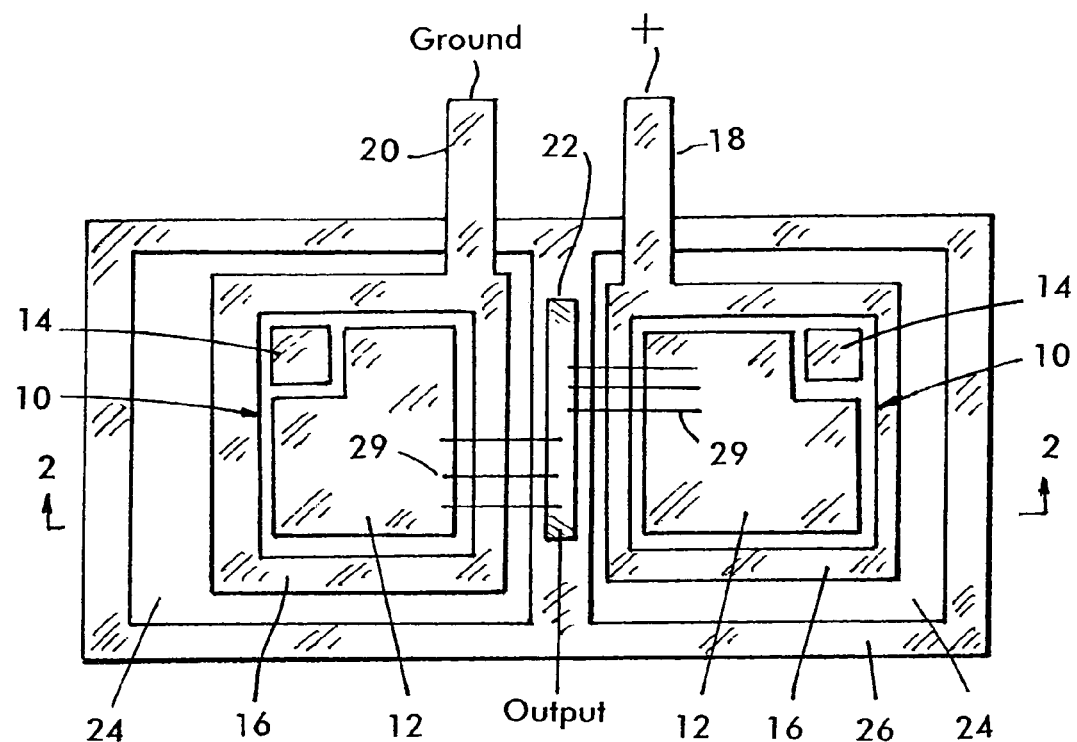
FIG. 1 schematically illustrates a power module according to the first embodiment of the present invention.
Figure 2:
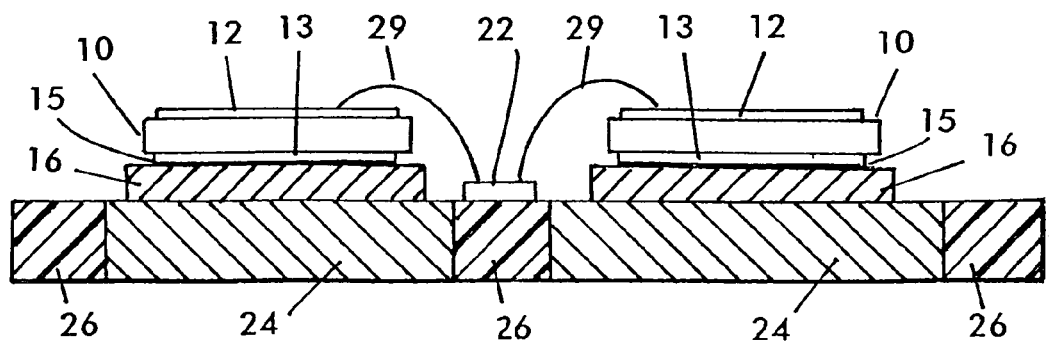
FIG. 2 show a cross-sectional view along line 2—2 in FIG. 1 of a power module according to the present invention viewed in the direction of the arrows.

Referring to FIGS. 1 and 2, a power module according to the first embodiment of the present invention includes two N-channel power MOSFETs 10. Each power MOSFET 10 is a vertical conduction type having a source contact 12 and a gate contact 14 disposed on a major surface thereof, and drain contact 13 disposed on an opposing surface thereof. Drain contact 13 of each power MOSFET 10 is electrically connected by a conductive layer 15 such as solder, conductive epoxy, or the like to a respective conductive pad 16. Each conductive pad 16 is integral with a respective lead 18, 20 and each lead is connectible to a respective pole of a power source, such as a pole of a battery. For example, lead 18 may be connected to the positive pole of a battery while lead 20 may be connected to the ground (negative) pole of the same battery. As a result, power MOSFET 10 operatively associated with lead 18 serves as the high side switch (B+pole) for a half-bridge circuit while power MOSFET 10 associated with lead 20 serves as the low side switch (B−pole) for the same half-bridge circuit.

In the first embodiment of the present invention the source contacts 12 of power MOSFETs 10 are electrically connected to a common conductive node 22 by, for example, wirebonds 29 thereby forming a half-bridge configuration having common conductive node 22 as its output node. Common conductive node 22 may be a conductive metal insert embedded in nonconductive frame 26 and connected to an external lead (not shown).

According to an aspect of the present invention, each conductive pad 16 is in direct contact with a respective heatsink 24. As a result, the overall thermal resistance of a power module according to the present invention is improved.

According to another aspect of the present invention each heatsink 24 is electrically isolated from the other heatsink 24 by non-conductive frame 26 in which each heatsink is preferably embedded. According to a preferred embodiment, non-conductive frame 26 may be a polymer of the type typically used as a molding material. Other materials such as dielectric ceramics may also be used for forming the non-conductive frame 26.

According to another aspect of the present invention one heatsink 24 may be larger than the other heatsink 24 so that the thermal gradient between the heatsinks 24 may be minimized or eliminated in order to reduce thermal stress on the module.

It should be noted that although not shown specifically, power MOSFETs 10 in a module according to the present invention may be controlled by appropriate control circuitry connectible to gate contact 14 of each power MOSFET 10. The control circuitry may be packaged together with a power circuit arrangement according to the present invention to form an integrated device, or a power circuit arrangement according to the present invention may be packaged and connected to a control circuitry through external connections. In either case, the particular packaging is a design choice which would depend upon the mode in which the power module is intended to be used.

Figure 3:
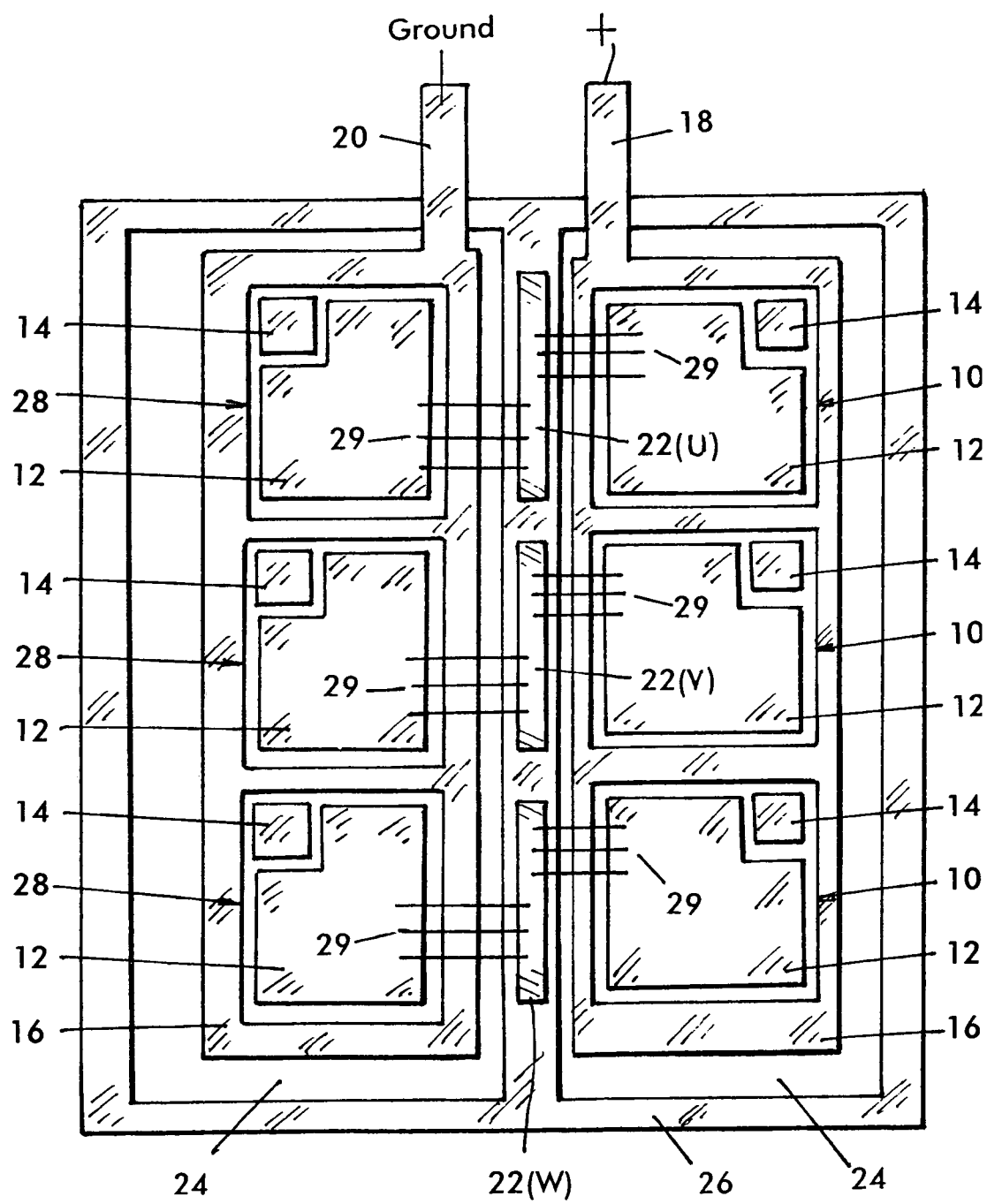
FIG. 3 schematically illustrates a power module according to the second embodiment of the present invention.

Referring to FIG. 3, in a power module according to the second embodiment of the present invention, three N-channel power MOSFETs 10 are electrically connected at their drain side to a conductive pad 16 as described earlier with reference to the first embodiment of the present invention, and three P-channel power MOSFETs 28 are electrically connected at their drain side to another conductive pad 16.

A power module according to the second embodiment of the present invention includes three output phases, each being associated with a respective half-bridge circuit. Each half-bridge circuit is implemented by a P-channel MOSFET 28 and an N-channel MOSFET 10 each having a source contact electrically connected via wirebonds 29 to a respective common conductive node 22 each of which may be electrically connected to an external lead (not shown). Each conductive node 22 thus serves as an output node for a respective half-bridge circuit. N-channel MOSFETs 10 serve as the high side switches connected to the positive pole of the power supply while P-channel MOSFETs 28 serve as the low side switches connected to the ground pole of the power supply. In other respects, a power module according to the second embodiment is similar to a power module according to the first embodiment.

It should be noted that the present invention is not limited to power MOSFETs, but may include bipolar transistors, IGBTs, or any other power device.

In addition, the present invention is not limited to the particular circuit configurations shown by FIG. 1 and FIG. 2. Other circuit configurations can be implemented using the principles of the present invention.

Thus, a power module according to the present invention can include a circuit implemented according to the following further examples 1a–1d and 2a–2d. Each further example corresponds to a respective figure, which for the convenience of the reader includes connectivity information.

Figure 4A:
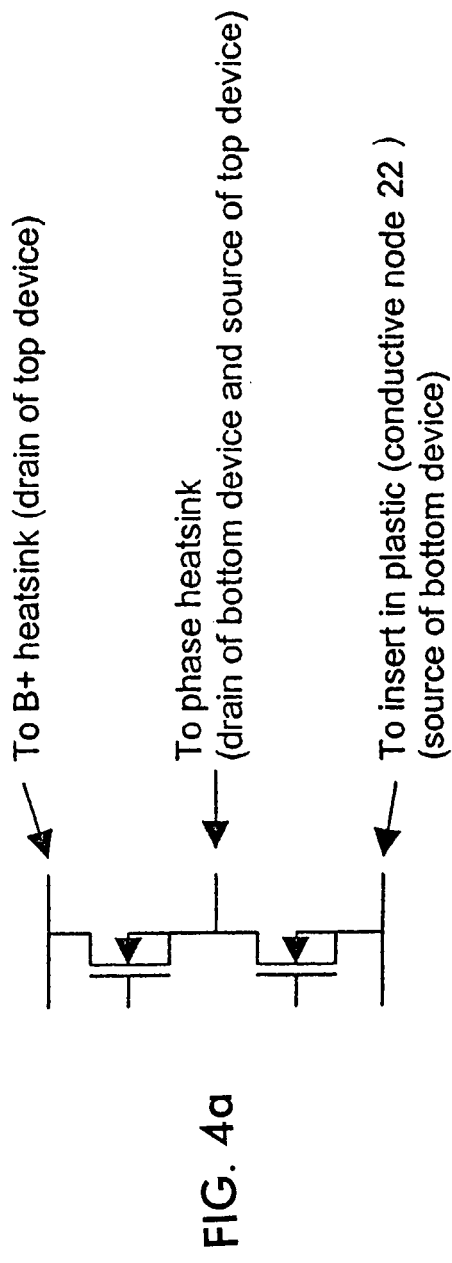
Figure 4B:
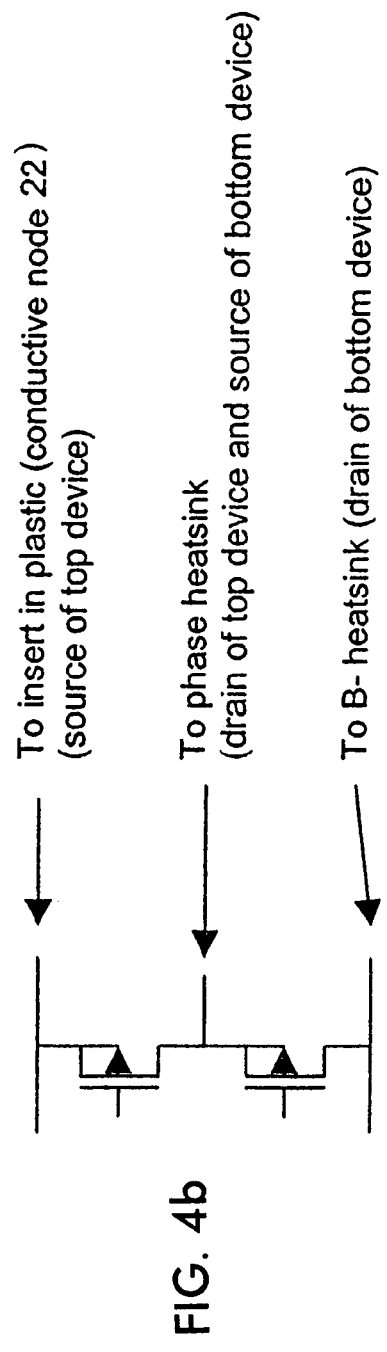
Figure 5A:
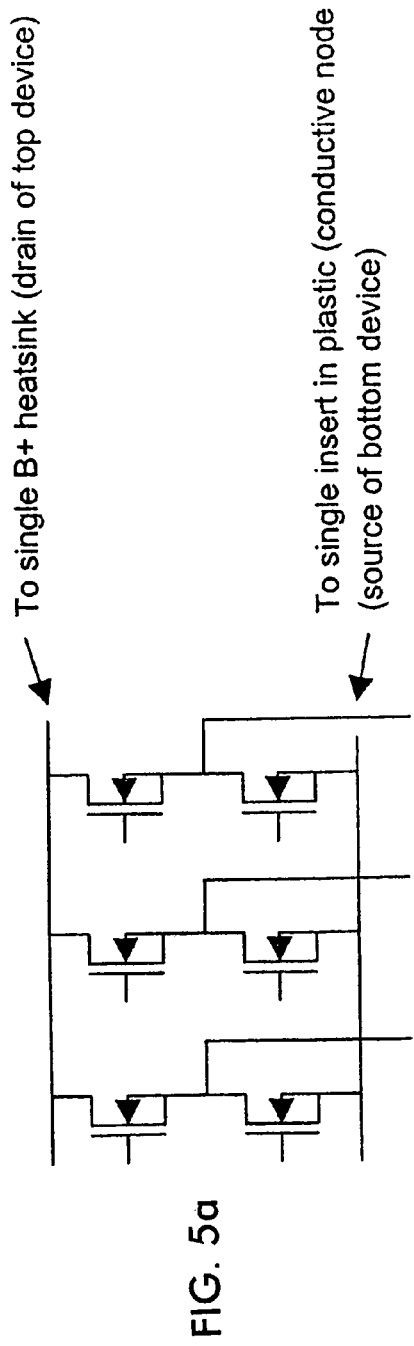
FIGS. 5a–5d illustrate further examples of circuits which can be incorporated in modules according to the present invention.
Figure 5B:
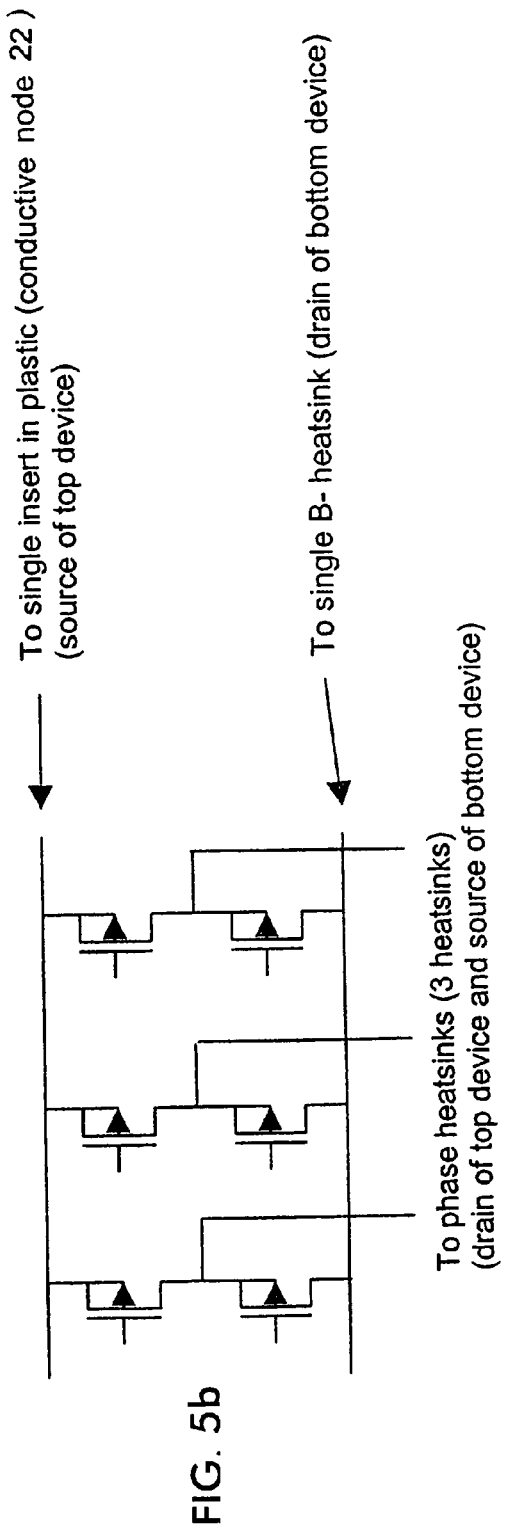
Figure 5C:
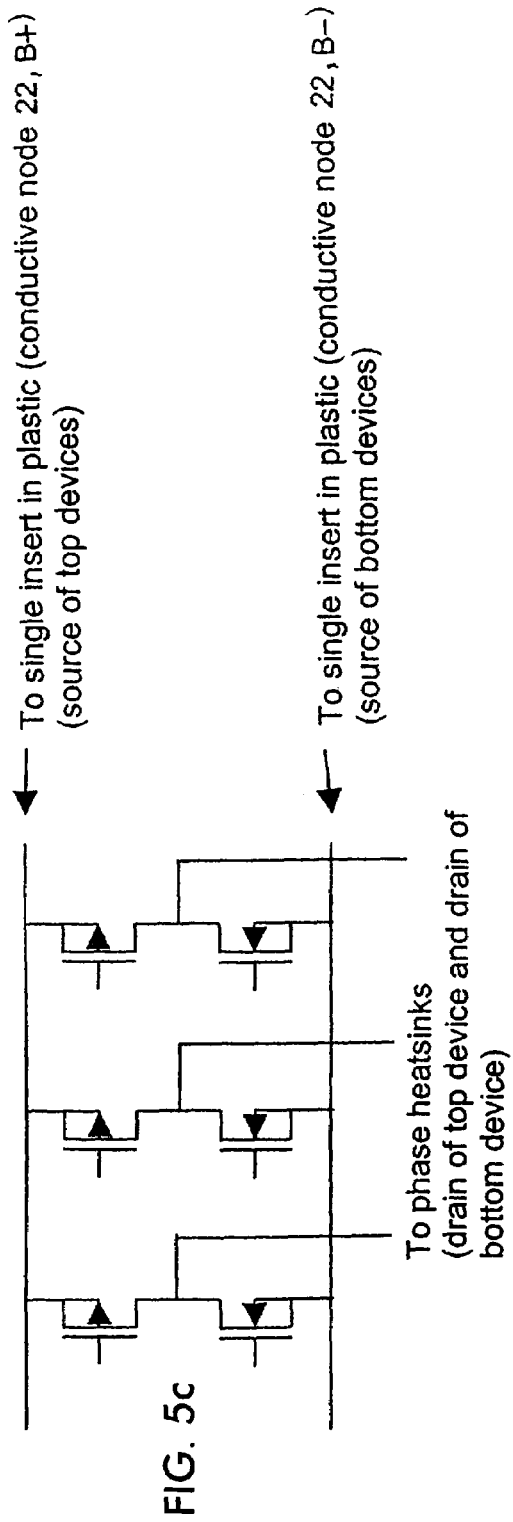
Figure 5D:
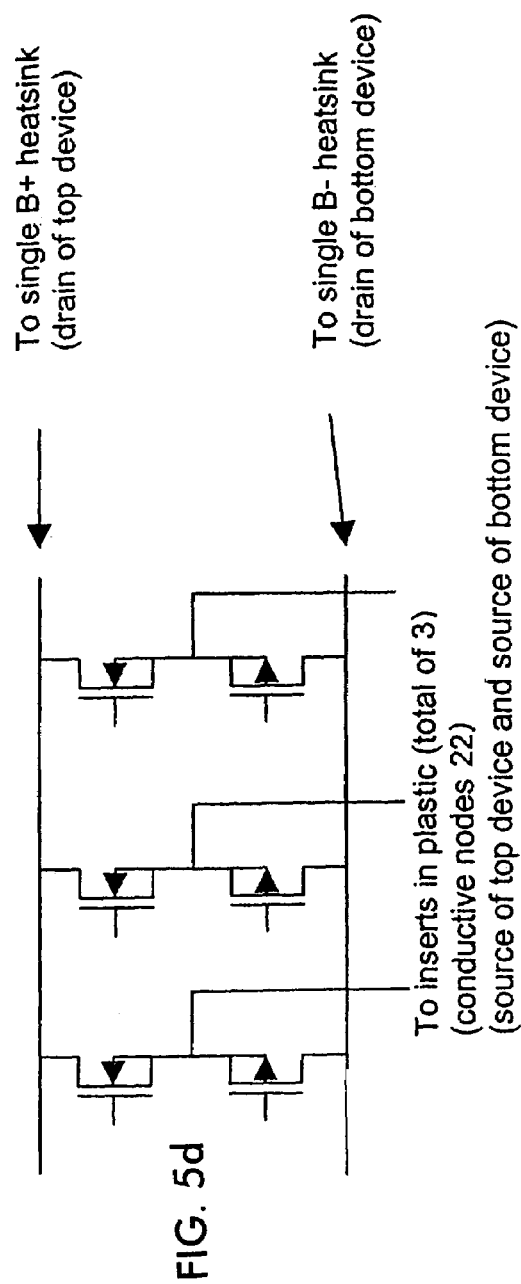

1. half bridge Power Modules:
   a. 2 N-channel devices: 2 non-isolated heatsinks (B+ and phase isolated heatsinks) (See FIG. 4a);
   b. 2 P-channel devices: 2 non-isolated heatsinks (B− and phase isolated heatsinks) (See FIG. 4b);
   c. P-channel device on top, N-channel device on bottom: 1 non-isolated heatsink (connected to phase) (See FIG. 4c);
   d. P-channel device on bottom, N-channel device on top : 2 non-isolated heatsinks (B+ and B− (Same circuit as FIG. 1)) (See FIG. 4d).
2. K-phase bridge Power Module:
   a. K*2 N-channel devices (K half bridges as Example 1a): K+1 non-isolated heatsinks (B+ and K phases) (See FIG. 5a);
   b. K*2 P-channel devices (K half bridges as Example 1b): K+1 non-isolated heatsinks (B− and K phases) (See FIG. 5b);
   c. K*P-channel devices on top, K*N-channel devices on bottom (K half bridges as Example 1c): K non-isolated heatsinks (See FIG. 5c);
   d. K*P-channel devices on bottom, K*N-channel devices on top (K half bridges as Example 1d): 2 non-isolated heatsinks (See FIG. 5d).

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power module comprising:
   a first lead frame having a first conductive pad;
   a first power device disposed on and electrically connected to said first conductive pad;
   a first heatsink in thermal contact with said first conductive pad; wherein there is no intermediate body disposed between said first conductive pad and said heatsink that retards heat transference from said first power device to said first heatsink; and
   a second lead frame having a second conductive pad, a second power device disposed on and electrically connected to said second conductive pad, and a second heatsink in thermal contact with said second conductive pad, wherein there is no intermediate body between said second conductive pad and said second heatsink that retards heat transference from said second power device to said second heatsink, and wherein said second heatsink is larger than said first heatsink whereby a thermal gradient between said heatsinks may be reduced to reduce thermal stresses on said module.

2. A power module according to claim 1, further comprising a lead integrally connected to said first conductive pad.

3. A power module according to claim 1, wherein said first heatsink and said second heatsink are electrically isolated.

4. A power module according to claim 1, wherein said first heatsink and said second heatsink are disposed within a common frame.

5. A power module according to claim 1, wherein said first power device and said second power device are arranged to form a half-bridge circuit.

6. A power module according to claim 1, wherein said first and second power device are power MOSFETs each having its electrode connected electrically to a respective conductive pad.

7. A power module according to claim 1, wherein said first and second power devices are N-channel power MOSFETs each having its drain electrode electrically connected to a respective conductive pad.

8. A power module according to claim 7, further comprising a common conductive node, and wherein each of said N-channel power MOSFETs includes a source electrode electrically connected to said common conductive node.

9. A power module according to claim 1, wherein said first power device is a P-channel power MOSFET and said second power device is an N-channel power MOSFET.

10. A power module according to claim 9, further comprising a common conductive node, and wherein each of said MOSFETs includes a source electrode connected to said common conductive node.

\* \* \* \* \*